United States Patent [19]
Manaresi et al.

[11] Patent Number: 5,825,229
[45] Date of Patent: Oct. 20, 1998

[54] ELECTRONICALLY TUNABLE VOLTAGE LEVEL SHIFTER AND AMPLIFIER THEREFOR

[75] Inventors: Nicolò Manaresi; Eleonora Franchi, both of Bologna; Dario Bruno, Palermo; Biagio Giacalone, Trapani; Vincenzo Matranga, Palermo, all of Italy

[73] Assignee: Co. Ri. M.Me—Consorzio Per la Ricera Sulla Microelettronica Nel Mezzogiorno, Catagnia, Italy

[21] Appl. No.: 594,708

[22] Filed: Jan. 31, 1996

[30] Foreign Application Priority Data

Jan. 31, 1995 [EP] European Pat. Off. .............. 95830025

[51] Int. Cl.[6] ...................................................... H03L 5/00
[52] U.S. Cl. .......................... 327/333; 327/361; 327/404; 326/62
[58] Field of Search ..................... 323/315, 316; 327/355, 361, 403, 404, 333; 326/62, 63, 80

[56] References Cited

U.S. PATENT DOCUMENTS

| | | | |
|---|---|---|---|
| 4,251,743 | 2/1981 | Hareyama | 323/316 |
| 4,323,846 | 4/1982 | Haraszti | 323/311 |
| 4,399,399 | 8/1983 | Joseph | 323/316 |
| 4,689,607 | 8/1987 | Robinson | 323/316 |
| 4,697,154 | 9/1987 | Kousaka et al. | 323/315 |
| 5,117,177 | 5/1992 | Eaton, Jr. | 323/314 |
| 5,124,666 | 6/1992 | Liu et al. | 330/253 |
| 5,319,268 | 6/1994 | Lyon et al. | 307/529 |
| 5,481,179 | 1/1996 | Keeth | 323/315 |
| 5,627,456 | 5/1997 | Novof et al. | 323/315 |
| 5,629,614 | 5/1997 | Choe et al. | 323/315 |

FOREIGN PATENT DOCUMENTS

| | | |
|---|---|---|
| 0 325 299 | 7/1989 | European Pat. Off. . |
| 0 535 951 | 4/1993 | European Pat. Off. . |
| WO 9006547 | 6/1990 | WIPO . |

OTHER PUBLICATIONS

Wang, "Automatic $V_T$ Extractors Based on an n X n² MOS Transistor Array and Their Application," *IEEE Journal of Solid–State Circuits* 27(9):1277–1285, Sep. 1992.

Kaulberg, "A CMOS Current–Mode Operational Amplifier," *IEEE Journal of Solid–State Circuits* 28(7)849–852, Jul. 1993.

*Primary Examiner*—Timothy P. Callahan
*Assistant Examiner*—Jung Ho Kim
*Attorney, Agent, or Firm*—David V. Carlson; Robert Iannucci; Seed and Berry LLP

[57] ABSTRACT

A voltage level shift circuit has a first input receiving a first voltage signal and a second input receiving a second voltage signal. The voltage level shift circuit is structured to generate an output voltage at an output terminal which is equal to a sum of the first and second voltage signals. The first voltage signal may be varied to vary a shift of the second voltage signal.

18 Claims, 3 Drawing Sheets

ELECTRONICALLY TUNABLE VOLTAGE LEVEL SHIFTER AND AMPLIFIER THEREFOR

TECHNICAL FIELD

The present invention relates to integrated circuits, and in particular, to a level shifter for an analog signal processing system.

BACKGROUND OF THE INVENTION

Level shift finds various applications and in particular in signal processing and it exhibits well known problems and has seen various solutions proposed in the literature over the years.

In the article by Zhenua Wang, "A CMOS . . . Analog Multiplier . . . ", in IEEE Journal of Solid-State Circuits, Vol. 26 No. 9 pages 1293–1301, September 1991, is illustrated in FIG. 3(a) a simple level shift circuit shown also in the annexed FIG. 1.

This circuit has a first input I1 and a second input I2 respectively for input of a first and a second voltage signal and has an output OT. Between the output OT and the ground terminal GND is obtained a voltage corresponding to the voltage between the input I2 and ground subtracted by the voltage between the input I1 and ground, i.e., voltage at I2 shifted downward by the voltage at I1.

The circuit comprises: a) a first n-channel MOS transistor Q1 having a control terminal G1, a first S1 and a second D1 main conduction terminals identifying a main conduction path, and b) a second transistor Q2 of the same type as said first transistor Q1 and having a control terminal G2, a first S2 and a second D2 main conduction terminals identifying a main conduction path.

The terminal D2 is connected to a power supply terminal VDD, the terminal G2 is connected to the input I2, the terminal S2 is connected to the terminal D1, the terminal G1 is connected to the input I1, and the terminal S1 is connected to a ground terminal GND. The output OT is connected to the terminal S2 or equivalently to the terminal D1.

Applying a certain voltage between the terminal G1 and the terminal S1, i.e., ground, of the transistor Q1 will cause a corresponding current in its main conduction path. Ignoring the current flowing in a possible load connected to the output OT, said current also flows in the main conduction path of the transistor Q2. If the two transistors are approximately equally matched, between the terminal G2 and the terminal S2 of the transistor Q2 there will be established a voltage equal to that present between the terminal G1 and the terminal S1. Now applying a voltage signal between the input I2 and ground, the potential at the output OT will correspond to the potential at the input I2 less the potential at the input I1.

Alternatively, a variation of this circuit, may be made by means of p-channel transistors. This way there is obtained an upward level shifter. Unfortunately in this case the voltage applied to the first input must be relative to the power supply terminal and not to ground while the voltage at the second input I2 is measured relative to ground.

SUMMARY OF THE INVENTION

One object of the present invention is to provide a circuit whose input voltages are measured with respect to the same reference potential.

By applying the first voltage signal not to the control terminal but to one of the main conduction terminals, it is unnecessary to connect the two transistors in series and both can therefore be coupled to the same potential reference.

This is particularly advantageous when upward level shifts (hence by means of p-channel MOS transistors) are needed but a corresponding voltage relative to the positive power supply terminal is not available.

BRIEF DESCRIPTION OF THE DRAWINGS

The invention is clarified by the description given below considered together with the annexed drawings wherein.

DETAILED DESCRIPTION OF THE INVENTION

Figure 1:
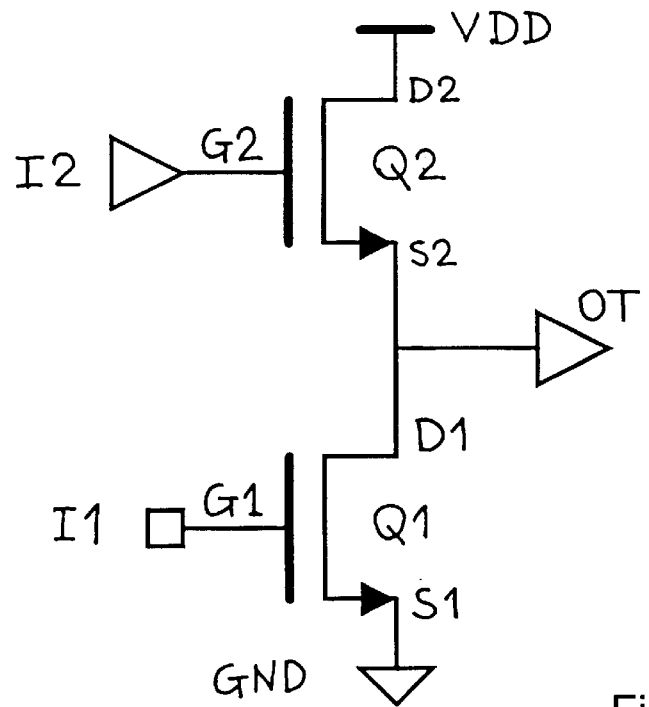
FIG. 1 shows a circuit in accordance with the prior art.
Figure 2:
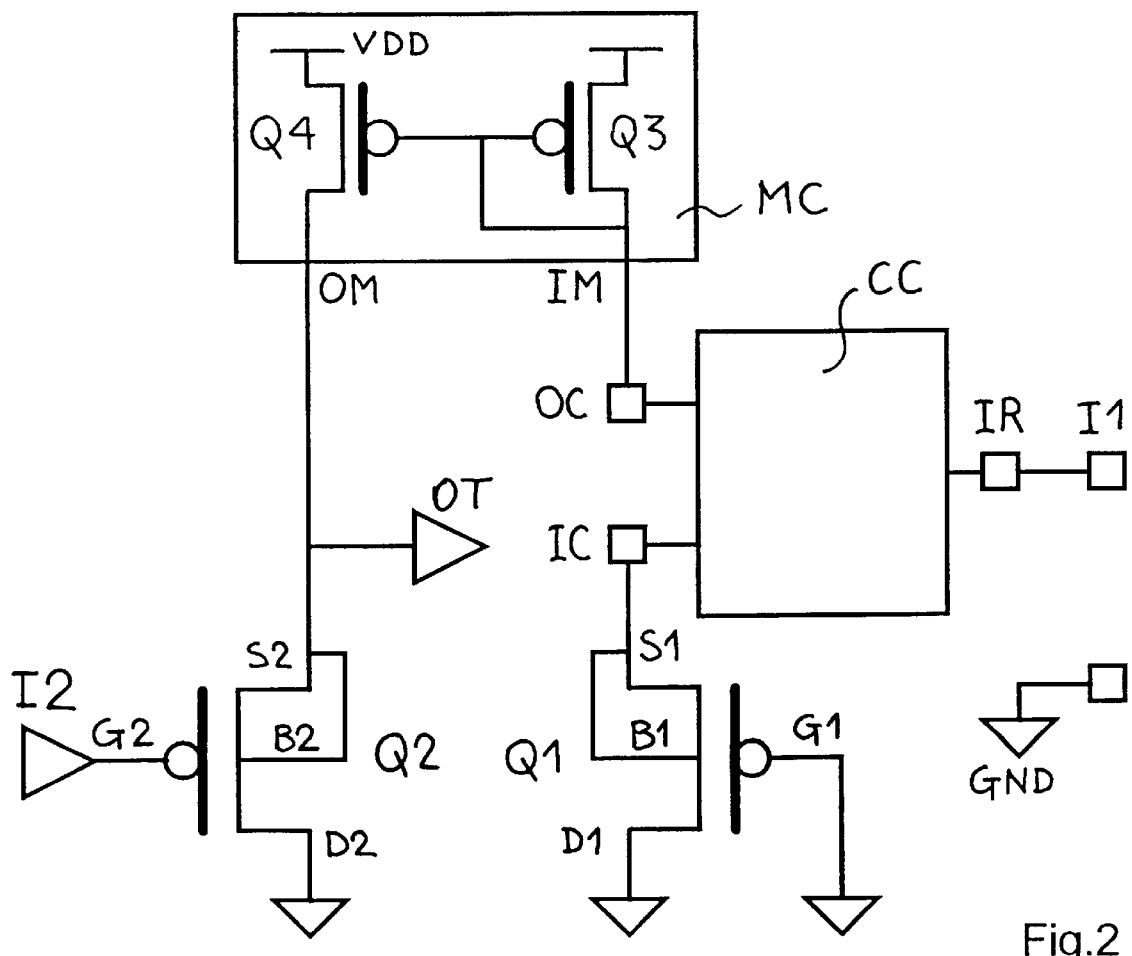
FIG. 2 shows a first circuit in accordance with the present invention.

The circuit of FIG. 2 in accordance with the present invention has a first input I1 and a second input I2 respectively for the input of first and second voltage signals and has an output OT. Between the output OT and the ground terminal GND is achieved a voltage corresponding to the sum of the voltage between the input I2 and ground, and the voltage between the input I1 and ground. In other words it shifts the voltage at the input I2 upward by the voltage present at the input I1.

The circuit comprises: a) a first p-channel MOS transistor Q1 having a control terminal G1, a first S1 and a second D1 main conduction terminals identifying a main conduction path, and b) a second transistor Q2 of the same type as said first transistor Q1 and having a control terminal G2, a first S2 and a second D2 main conduction terminals identifying a main conduction path.

The first signal is applied effectively between the terminal G1 and the second terminal S1. The second input I2 is coupled with the terminal G2. The currents flowing in the conduction paths of the first Q1 and the second Q2 transistors are mutually proportional and one made from the other. The output OT is coupled with the terminal S2.

According to the present invention, the terminal G1 is connected to a potential reference GND and that the first signal is applied effectively to the terminal S1.

In greater detail, the drain terminals D1 and D2 of the transistors Q1 and Q2 are connected to the reference GND which in particular corresponds to ground. Their bulk terminals B1 and B2 are connected respectively to the source terminals S1 and S2. In this manner the two transistors Q1 and Q2 are unaffected by "body" but should be provided in two separate "wells" of any integrated circuit.

The circuit also comprises a current mirror MC having at least two input-output terminals IM and OM respectively coupled to the terminals S1 and S2 of the transistors Q1 and Q2. A simple embodiment of the mirror MC consists of two p-channel MOS transistors Q3 and Q4 having source terminals connected to a potential reference, typically the power supply VDD, control terminals connected together, and drain terminals connected respectively to the input terminal IM and output terminal OM. The transistor Q3 is diode-connected.

Between the terminal IM and the terminal S1 is placed a current conveyor CC having a reference terminal IR connected to the input I1 and two terminals IC and OC respectively input and output. In this circuit the current to the terminal IC is equal to the current at the terminal OC (from this viewpoint it is equivalent to a short circuit) and the potential at the terminal IC is effectively equal to the potential at the terminal IR.

Figure 3:
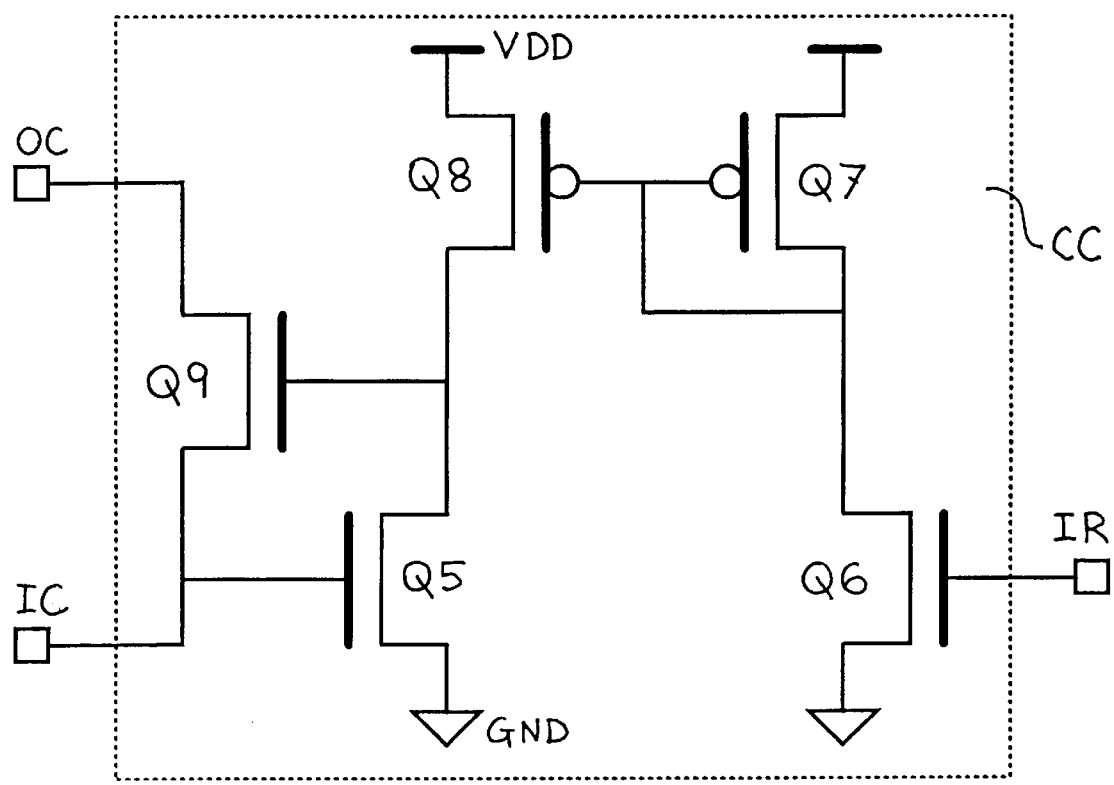
FIG. 3 shows a circuit diagram of a possible embodiment of a conveyor circuit to be used in the circuit of FIG. 2.

One embodiment of the conveyor CC is shown in FIG. 3. It comprises a current mirror consisting of two p-channel MOS transistors Q7 and Q8 having source terminals connected to a potential reference typically the power supply VDD, control terminals connected together, and drain terminals connected respectively to the input terminal and output terminal of the mirror (the transistor Q7 is also diode-connected). It also comprises two n-channel MOS transistor Q5 and Q6 having source terminals connected to a potential reference typically ground GND, drain terminals respectively connected to the drain terminals of the transistors Q8 and Q7, the control terminal of the transistor Q6 is connected to the terminal IR and the control terminal of the transistor Q5 is connected to the terminal IC. Finally it comprises an n-channel MOS transistor Q9 having source terminal connected to the terminal IC, drain terminal connected to the terminal OC and control terminal connected to the drain terminal of the transistors Q5 and Q8. The currents at the inputs IC and OC are approximately equal since the current absorbed by the control terminal of the MOS transistor Q5 is negligible. The potentials at the terminals of the transistor Q9 are stabilized in steady state at a value such that the potential at the terminal IR is equal to the potential at the terminal IC given the symmetry of the network formed by the transistors Q5, Q6, Q7, Q8.

Preferably said circuit is sized so that the MOS transistors are operated in steady state in saturation condition. It is recalled that in a first approximation the current of an MOS transistor in saturation does not depend on its voltage VDS.

The circuit of FIG. 2 provides an upward shift, i.e., it adds to the signal present at the input I2 a positive constant.

The advantages of such a circuit are operation independently of the temperature and of the absolute value of the process parameters, naturally if the signal supplied to the input I1 is dependent thereon and this can be obtained in various ways, e.g., by means of "bandgap". This is due to the fact that the circuit is based on the balance and/or imbalance of the devices Q1 and Q2.

In addition, since the signal at the input IR is relative to ground, operation is also independent of the supply voltage.

Naturally there are operating limitations (which in reality are not very restrictive), i.e., the maximum output voltage corresponds to the supply voltage reduced by the drain-source voltage in saturation of the transistors Q3 and Q4, the minimum voltage at the input I2 is zero while the minimum voltage at the input I1 corresponds to the threshold voltage of the transistor Q1.

Figure 4:
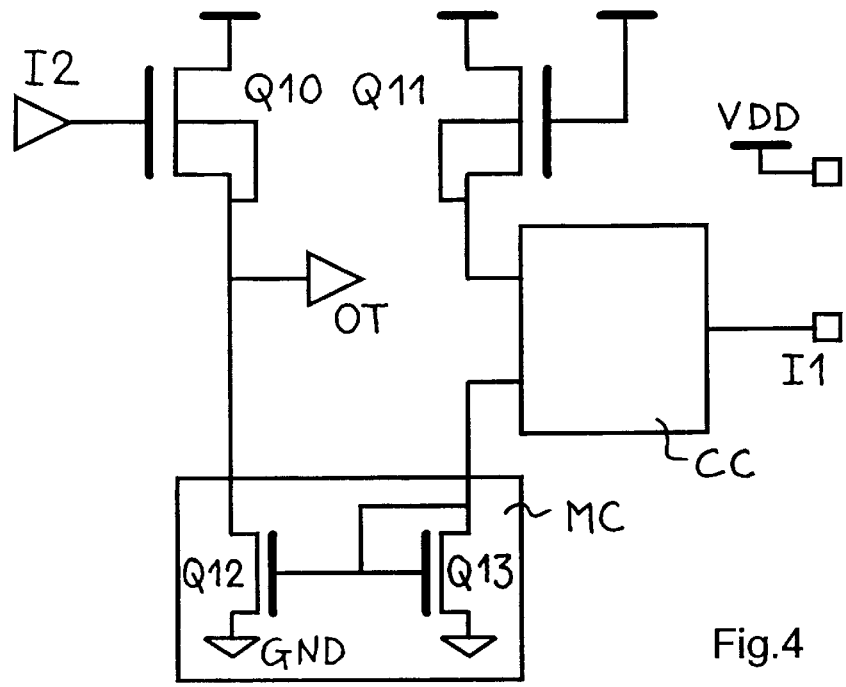
FIG. 4 shows a second circuit in accordance with the present invention.

FIG. 4 shows a circuit analogous to that of FIG. 2 but based on two transistors Q10 and Q11, again of the MOS type, but n-channel. In this case the drain terminals of the transistors are connected to a power supply terminal VDD instead of to a ground terminal GND. The mirror MC is made up of two n-channel transistors Q12 and Q13.

Figure 6:
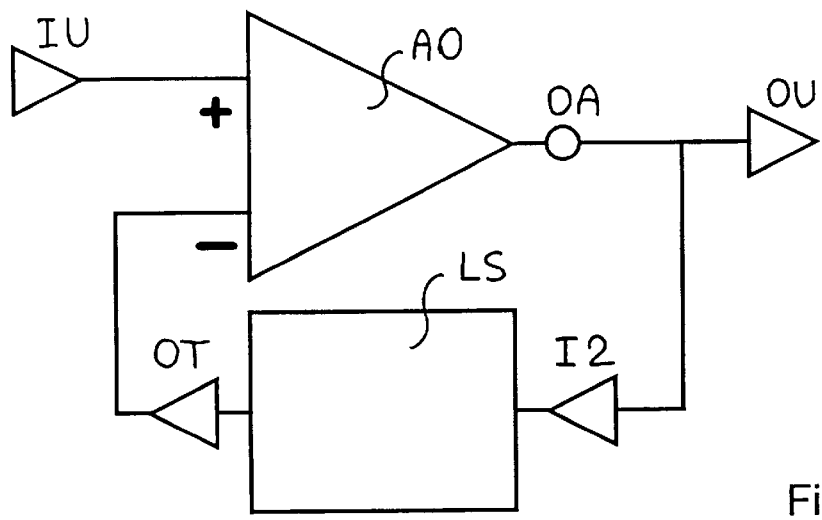
FIG. 6 shows a fourth circuit in accordance with the present invention.
Figure 5:
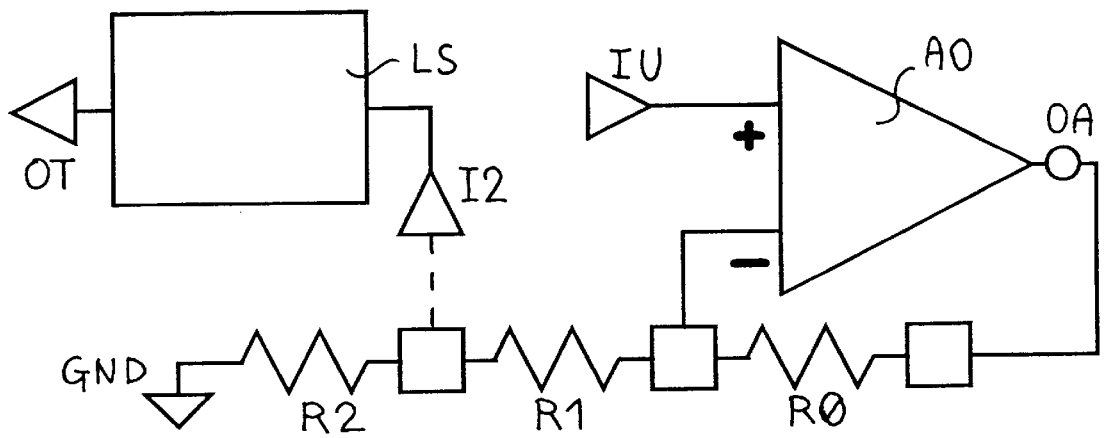
FIG. 5 shows a third circuit in accordance with the present invention.
Figure 7:
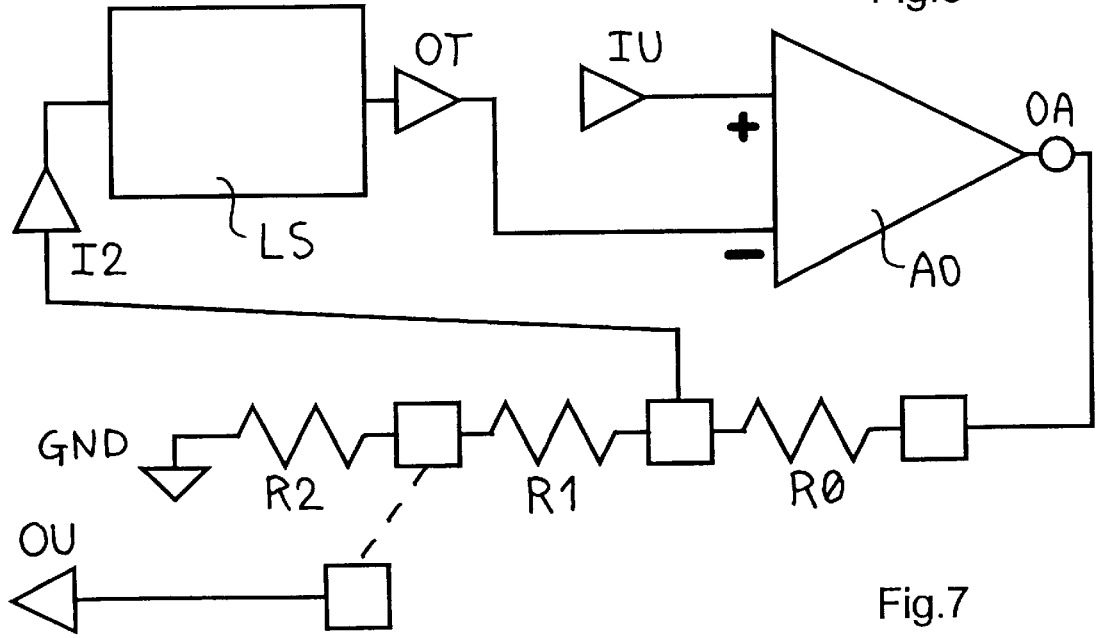
FIG. 7 shows a fifth circuit in accordance with the present invention.

The circuits shown in FIGS. 5, 6 and 7 consist of a shift circuit LS similar to one of the shift circuits previously described herein. Accordingly, only the input I2 and the output OT of the circuit LS are shown.

The circuit of FIG. 5 exhibits another input IU and comprises a circuit LS and an amplifier connected to the input I2. The gain of this amplifier depends only on the ratio of the value of a parameter of at least two circuit elements of the same type. In this manner its performance is independent of the technology and temperature if said circuit elements are provided in an integrated circuit.

A very simple embodiment of said amplifier shown in FIG. 5 comprises an operational amplifier AO having relatively high gain and having a non-inverting "+" input connected to the input IU, the output OA connected to a voltage divider, and inverting input "−" connected to an intermediate outlet of said divider. The input I2 is connected to an intermediate outlet of the same divider.

In the circuit of FIG. 5 the divider is made up of three resistors R0, R1, R2 connected in series between the output OA and a ground terminal GND. Depending on the outlet to which the input I2 is connected the amplifier gain will be:

1+R0/R1+R2;1;R1/R1+R2.

In this manner there is achieved an adaptation (compression or expansion) of the dynamic range of the signal at the input in addition to its upward shift.

Naturally the same provision can be used to adapt the value of the signal supplied to the input I1.

If it is desired to obtain shift downward of a predetermined amount and there is available a voltage relative, for example, to ground corresponding to said value the circuit of FIG. 6 can be used. Operation of said circuit is based on the fact that by inserting a circuit block having a predetermined function, in the return path of a feedback loop, a new circuit block having inverted function is obtained.

Said circuit has another input IU and another output OU and comprises a circuit LS and an operational amplifier AO having a relatively high gain and having a non-inverting input "+" coupled with the input IU, inverting input "−" coupled with the output OT, and output OA coupled with the output OU and the input I2.

A variation of said circuit is shown in FIG. 7. Compared with the circuit of FIG. 6 there is a voltage divider permitting adaptation of the dynamic range of the signal supplied to the input IU in addition to its shift downward. In addition both the output OU and the input I2 are connected to outlets (intermediate or end) of the divider.

In the circuit of FIG. 7 the divider is made up of three resistors R0, R1, R2 connected in series between the output OA and a ground terminal GND. Depending on the outlet to which is connected the output OU the correction factor of the dynamic range will be:

1+R0/R1+R2;1;R1/R1+R2.

Attention is drawn to the fact that the same factor will be applied to the signal at the input I1, i.e., to the amount of the shift.

Maximum voltage at the output OU can have values between zero and the supply voltage. Voltage at the input IU can take any value while minimum voltage at the input I1 corresponds to the threshold voltage of the transistor Q1.

In the foregoing description reference is often made to direct connections between the various circuit elements but it will be clear to those skilled in the art that fairly often indirect connections, i.e., with other, intermediate, circuit elements, which can also be referred to as "couplings", could be used without impairing the operation of the associated circuits.

The circuits described above are based on two p-channel MOS transistors. If it were necessary to use two n-channel transistors it would be necessary to use dual circuits. Some examples of such duality would be that the ground terminals GND must be replaced by power supply terminals VDD, power supply terminals VDD by ground terminals GND, the n-channel transistors by p-channel transistors, the p-channel transistors by n-channel transistors, etc. The circuit of FIG. 4 is, e.g., the dual (in the above sense) of the circuit of FIG. 2.

It is also possible to use, instead of the MOS transistors, other types of transistors, e.g., the BJT type. In this case however operation of the circuit is much more critical because the bases of junction transistors would be voltage piloted. For this purpose it might be advantageous to place resistors in series with the emitters of said transistors.

The embodiments described above can be brought back to an instruction of the methodological type which consists of providing a voltage shift by means of an electrical circuit of a second voltage signal supplied to a second input of said circuit with the magnitude of said shift linked to a first voltage signal supplied to a first input of said circuit in accordance with the phases:

(a) supplying the first signal as control voltage of a first transistor between a control terminal thereof and a first main conduction terminal thereof so as to cause a first current in the main conduction path thereof, (b) supplying a second current proportional to and taken from said first current to a second transistor Q2 of the same type as the first and in the main conduction path thereof so as to cause a control voltage between a control terminal and a first main conduction terminal of the second transistor, (c) applying to the control terminal of the second transistor the second signal, and (d) taking a voltage signal from the first main conduction terminal of the second transistor, and in which the control terminal of the first transistor is connected to a potential reference and in particular to ground and in which the first signal is applied effectively to the first main conduction terminal of the first transistor.

It is particularly advantageous to take the second current from the first current by means of mirroring (typically by amplification of the unitary mirror if the two transistors are equal) so that their value is closely and intrinsically linked. In general the relationship which should prevail for the circuit to operate in the best manner is:

$$A*K1*Vt1=K2*Vt2$$

where A is the mirror amplification, K1 an K2 are the W:L ratios respectively of the first and second transistors, and Vt1 and Vt2 are the threshold voltages respectively of the first and second transistors.

If both transistors are the MOS type and are operated in saturation condition, the potential at the first terminal of the second transistor is quire independent of the potential at the control terminal of said transistor, thus improving circuit operation.

Again in this situation, it is advantageous to connect the bulk terminals of the transistors to the respective source terminals so as to eliminate body effect.

Finally, as mentioned above, the present invention finds advantageous application in a signal processing circuit system using and comprising at least one circuit like those described above to shift the level of at least one input or output signal.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A voltage level shifter for shifting a voltage level of a first signal by an amount proportional to a voltage level of a second signal, comprising:

first and second input terminals for respectively receiving the first and second signals;

a first transistor having a control terminal coupled to the first input terminal;

a second transistor having a control terminal coupled to a reference potential;

a current mirror circuit having a first mirror terminal coupled to the first transistor and a second mirror terminal, the current mirror circuit being structured to mirror a current through the second mirror terminal at the first mirror terminal, a common node coupled to the first transistor and to the first mirror terminal defining an output terminal of the voltage level shifter; and a current conveyor coupled between the second mirror terminal and the second transistor, the current conveyor having an input coupled to the second input terminal to receive the second signal, the current conveyor being structured to couple a current to the second transistor which is substantially equal to the current through the second mirror terminal and to couple the second signal to the second transistor such that an output voltage is generated at the output terminal which is substantially equal to the voltage level of the first signal shifted by an amount proportional to the voltage level of the second signal.

2. The voltage level shifter according to claim 1 wherein the control terminal of the second transistor is connected to either a supply voltage or a ground.

3. The voltage level shifter according to claim 1 wherein the first and second transistors are p-channel type transistors formed in two separate wells of an integrated circuit, each of the first and second transistors having a bulk terminal connected to a source terminal.

4. The voltage level shifter according to claim 1, further comprising:

a voltage divider having a first tap node connected to the first or second input terminal, and a second tap node; and a signal amplifier having an output connected to the voltage divider and an input connected to the second tap node.

5. The voltage level shifter according to claim 1, further comprising:

a signal amplifier having an output connected to the first or second input terminal, and an input connected to the output terminal of the voltage level shifter.

6. The voltage level shifter according to claim 1, further comprising:

an operational amplifier having an output connected to the first or second input terminal, and an inverting input connected to the output terminal of the voltage level shifter.

7. A method for shifting a second voltage signal supplied to a second input of a circuit by a voltage based on a first voltage signal supplied to a first input of said circuit, the method comprising of:

coupling said first voltage signal between a control terminal and a first main conduction terminal of a first transistor to cause the first transistor to conduct a first currents;

supplying a second current proportional to said first current to a second transistor to induce a voltage difference between a control terminal and a first main conduction terminal of said second transistor;

applying said second voltage signal to the control terminal of said second transistor; and taking receiving a shifted voltage signal from said first main conduction terminal of said second transistor, said shifted voltage being substantially equal to said second voltage signal shifted by a voltage proportional to said first voltage signal.

8. The method according to claim 7, further comprising the act of providing the first current and the second current from a current mirror circuit, the second current being generated based on the first current.

9. The method according to claim 7, further comprising the act of varying the first voltage signal to vary the voltage by which the second voltage signal is shifted.

10. The method according to claim 9, further comprising:

supplying a reference voltage signal to the control terminal of the first transistor;

operating the first and second transistors in a saturated condition; and varying the second voltage signal to vary the shifted voltage signal.

11. A voltage level shift circuit having first and second inputs coupled respectively to receive a first voltage signal and a second voltage signal and an output comprising:

a first transistor having a control terminal coupled to a reference potential and first and second terminals of a main conduction path;

a second transistor having a control terminal coupled to the second input and first and second terminals of a main conduction path, the output being coupled to the first terminal of the second transistor;

a current supply circuit structured to provide a first current from a first terminal and to provide a second current from a second terminal coupled to the second transistor, the second transistor being coupled to receive the second current, said circuit being structured to generate said second current in proportion to said first current, and a current transfer circuit having a first terminal coupled to the first terminal of the current supply circuit to receive the first current, a second terminal coupled to the first terminal of the first transistor, and an input terminal coupled to the first input of the voltage level shift circuit to receive the first voltage signal, the current transfer circuit being structured to provide a current to the first terminal of the first transistor in response to the first current and being structured to couple the first voltage signal to the first terminal of the first transistor such that an output voltage is provided at the output based on the first voltage signal and the second voltage signal.

12. The voltage level shift circuit according to claim 11 wherein said current supply circuit comprises a current mirror circuit having at least two input-output terminals respectively coupled to the first terminals of said first and second transistors.

13. The voltage level shift circuit according to claim 11 wherein said current transfer circuit comprises a current conveyor having a reference terminal and two input-output terminals, said reference terminal being coupled to said first input and one of said two input-output terminals being connected to said first terminal of said first transistor.

14. The voltage level shift circuit according to claim 13 wherein said current conveyor comprises a third transistor having a main conduction path coupled between said two input-output terminals and a network structured to control a potential between the input-output terminals via said third transistor.

15. The voltage level shift circuit according to claim 11 wherein said first and second transistors are p-channel MOS type transistors each having a bulk terminal connected to a respective source terminal, the first and second transistors being provided in two separate wells of an integrated circuit.

16. The voltage level shift circuit according to claim 11, further comprising at least one amplifier having a gain dependent upon a ratio of a resistance of each of two resistors, said amplifier having an output coupled to said first input or said second input.

17. The voltage level shift circuit according to claim 11, further comprising a third input and a second output and an operational amplifier having an inverting input, a non-inverting input and an output, said output of said voltage level shift circuit being coupled to said inverting input, said third input being coupled to said non-inverting input and said second output being coupled to said output of said operational amplifier and to said second input to constitute a feedback loop.

18. The voltage level shift circuit according to claim 17, further comprising a voltage divider comprising two resistors coupled in series to the output of said operational amplifier so that an amplitude of a signal coupled to said second output is proportional to an amplitude of a signal at said output of said operational amplifier.

* * * * *